(12) United States Patent
Sawicki et al.

(10) Patent No.: US 11,691,224 B2
(45) Date of Patent: Jul. 4, 2023

(54) CONFIGURABLE FIXTURE FOR CUTTING SHAPES

(71) Applicant: Magic Leap, Inc., Plantation, FL (US)

(72) Inventors: Joseph Christopher Sawicki, Austin, TX (US); Jeffrey Dean Schmulen, Austin, TX (US); Christophe Peroz, Tokyo (JP); Sharad D. Bhagat, Austin, TX (US)

(73) Assignee: Magic Leap, Inc., Plantation, FL (US)

(*) Notice: Subject to any disclaimer, the term of this patent is extended or adjusted under 35 U.S.C. 154(b) by 0 days.

(21) Appl. No.: 17/415,380

(22) PCT Filed: Dec. 20, 2019

(86) PCT No.: PCT/US2019/067819
§ 371 (c)(1),
(2) Date: Jun. 17, 2021

(87) PCT Pub. No.: WO2020/132424
PCT Pub. Date: Jun. 25, 2020

(65) Prior Publication Data
US 2022/0040796 A1 Feb. 10, 2022

Related U.S. Application Data (60) Provisional application No. 62/783,355, filed on Dec. 21, 2018.

(51) Int. Cl.
*B23K 26/38* (2014.01)
*B23K 26/00* (2014.01)
(Continued)

(52) U.S. Cl.
CPC ............ *B23K 26/38* (2013.01); *B23K 26/009* (2013.01); *B23K 26/02* (2013.01); *B23K 26/16* (2013.01);
(Continued)

(58) Field of Classification Search
CPC .... B23K 2103/42; B23K 26/00; B23K 26/38; B23K 26/009; B23K 26/02; B23K 26/16
(Continued)

(56) References Cited

U.S. PATENT DOCUMENTS 4,307,046 A 12/1981 Neefe
4,624,405 A 11/1986 Newell
(Continued)

FOREIGN PATENT DOCUMENTS

CN 103706956 A * 4/2014 ............ B23K 26/38
CN 104014939 A * 9/2014 ......... B23K 2103/08
(Continued)

OTHER PUBLICATIONS

Machine translation of CN 104014939 performed on Mar. 31, 2022.*
(Continued)

*Primary Examiner* — Tu B Hoang
*Assistant Examiner* — Alba T Rosario-Aponte
(74) *Attorney, Agent, or Firm* — Fish & Richardson P.C.

(57) ABSTRACT

A fixture used in the manufacture of an eyepiece, to cut the eyepiece to a particular shape, and a method of using the fixture to cut the eyepiece to have a desired shape. Embodiments are directed to a configurable fixture to align, hold, and protect a plastic sheet (e.g., a wafer) while a laser cutting apparatus is cutting one or more eyepieces out of the wafer. During the cutting, the fixture protects the eyepieces from reflected laser light by providing voids around the laser cutting lines, and by supporting each eyepiece near its perimeter. The fixture can be quickly rearranged for different eyepieces, different eyepiece shapes, and/or different plastic sheet sizes.

9 Claims, 11 Drawing Sheets

(51) Int. Cl.
  *B23K 26/02* (2014.01)
  *B23K 26/16* (2006.01)
  *B23K 26/402* (2014.01)
  *G02B 25/00* (2006.01)
  *B23K 103/00* (2006.01)

(52) U.S. Cl.
  CPC .......... *B23K 26/402* (2013.01); *G02B 25/001* (2013.01); *B23K 2103/42* (2018.08)

(58) Field of Classification Search
  USPC .............. 219/121.6, 121.67, 121.68, 121.21, 219/121.22; 264/400
  See application file for complete search history.

(56) References Cited

U.S. PATENT DOCUMENTS

| | | | |
|---|---|---|---|
| 5,227,606 A | | 7/1993 | Weeks et al. |
| 5,585,015 A | * | 12/1996 | Hayashi ............... B23K 26/702 219/121.72 |
| 6,562,698 B2 | | 5/2003 | Manor |
| 6,635,308 B1 | | 10/2003 | Forrest et al. |
| 2002/0017512 A1 | | 2/2002 | Heyerick et al. |
| 2002/0084566 A1 | | 7/2002 | Ries |
| 2005/0236382 A1 | | 10/2005 | Erlenmaier |
| 2006/0228650 A1 | * | 10/2006 | Matsuo ................. B23K 26/38 430/311 |
| 2011/0250423 A1 | | 10/2011 | Fukasawa |
| 2013/0001206 A1 | | 1/2013 | Yamamoto et al. |
| 2015/0174705 A1 | | 6/2015 | Schwartz |
| 2016/0031040 A1 | | 2/2016 | Chang et al. |
| 2018/0099354 A1 | * | 4/2018 | Deiss ....................... B26D 7/20 |
| 2018/0112351 A1 | * | 4/2018 | Kuo ......................... D06H 7/00 |

FOREIGN PATENT DOCUMENTS

| | | | | |
|---|---|---|---|---|
| CN | 206474803 U | | 9/2017 | |
| JP | 62003892 A | * | 1/1987 | ............. B23K 26/10 |
| JP | 2006320956 A | | 11/2006 | |
| JP | 2013103505 A | | 5/2013 | |

OTHER PUBLICATIONS

Machine translation of CN 103706956 performed on Mar. 31, 2022.*
International Search Report and Written Opinion in related International Application No. PCT/US2019/067819, dated Apr. 28, 2020, 11 pages.
Extended European Search Report in European Appln. No. 19900189.2, dated Aug. 24, 2022, 7 pages.
Office Action in Chinese Appln. No. 201980091477.6, dated Feb. 1, 2023, 7 pages (with English translation).

* cited by examiner

CONFIGURABLE FIXTURE FOR CUTTING SHAPES

CROSS-REFERENCE TO RELATED APPLICATION

This application is a US National Stage Application under 35 U.S.C. § 371 and claims the benefit of International Patent Application No. PCT/US2019/067819 entitled "CONFIGURABLE FIXTURE FOR CUTTING SHAPES" and filed on Dec. 20, 2019, which claims the benefit of U.S. Provisional Patent Application No. 62/783,355 entitled "CONFIGURABLE FIXTURE FOR CUTTING SHAPES" and filed on Dec. 21, 2018. The disclosures of the foregoing applications are incorporated herein by reference in their entirety.

BACKGROUND

In many industries, components are manufactured with high quality and high precision, such that the variation in the dimensions and shapes of the manufactured components are kept within an acceptably low tolerance. For example, precision and quality of manufactured eyepieces are typically important features of various types of optical devices. However, high precision can be difficult to achieve in optical devices. In particular, laser reflection of metal components can contribute to laser marks on transparent, plastic eyepieces.

SUMMARY

Embodiments of the present disclosure are generally directed to a configurable fixture for cutting shapes. More specifically, embodiments are directed to a configurable fixture that is used to cut eyepieces from a (e.g., plastic) wafer, a fixture employing multiple pins of different lengths to support and/or stabilize the wafer, and an inlay of the desired shape to be cut.

In general, innovative aspects of the subject matter described in this specification can be included in one or more embodiments of an apparatus for cutting a wafer into one or more shapes, the apparatus including a fixture including a first floor, wherein the first floor includes an array of pin holes configured to hold a plurality of pins; and an inlay that rests on short pins of the plurality of pins, wherein the inlay includes holes that receive medium pins of the plurality of pins to stabilize the inlay from moving in a horizontal direction parallel to the first floor, wherein the wafer rests on long pins of the plurality of pins while a laser cuts, from the wafer, a shape that corresponds to the inlay, and wherein the cut portion of the wafer rests on the inlay.

One or more embodiments can optionally include one or more of the following features.

In some embodiments, a thickness of the inlay and a length of the short pins provide a cutting trench for the laser.

In some embodiments, the fixture further includes a second floor below the first floor; the first floor and the second floor each include a second array of ventilation holes; and the fixture further includes a cavity, below the second floor, which connects to the second array of ventilation holes and to an air duct.

In some embodiments, the apparatus further includes a cover that rests on the wafer and on the long pins.

In some embodiments, the cover includes a gap in a region of the cover that corresponds to the position of the inlay.

In some embodiments, the inlay includes a recess; and the short pegs contact the inlay in the recess.

In some embodiments, cutting eyepieces from a wafer includes positioning the wafer in a fixture and laser cutting the wafer into a shape that corresponds to a shape of an inlay to yield a cut portion of the wafer. The fixture includes a floor defining an array of pin holes configured to hold a plurality of pins, and an inlay that rests on short pins of the plurality of pins. The inlay defines holes that receive medium pins of the plurality of pins to stabilize the inlay from moving in a direction parallel to the first floor. The wafer rests on long pins of the plurality of pins, and the cut portion of the wafer rests on the inlay.

In some embodiments, a vacuum may be applied to the floor to remove, from the fixture, debris generated by the laser cutting.

In some embodiments, the wafer may be positioned in direct contact with the inlay. A plastic film may be adhered to the wafer before laser cutting the wafer.

In some embodiments, a space defined by the fixture beneath the wafer is present along a cutting line of the laser. The space may reduce a reflection of the laser cutting the wafer.

In some embodiments, the short pins prevent bowing of the inlay during the laser cutting of the wafer.

In some embodiments, the laser cutting is achieved in in conjunction with a computer numerically controlled laser cutter.

It is appreciated that aspects and features in accordance with the present disclosure can include any combination of the aspects and features described herein. That is, aspects and features in accordance with the present disclosure are not limited to the combinations of aspects and features specifically described herein, but also include any combination of the aspects and features provided.

The details of one or more embodiments of the present disclosure are set forth in the accompanying drawings and the description below. Other features and advantages of the present disclosure will be apparent from the description and drawings, and from the claims.

DETAILED DESCRIPTION

Embodiments of the present disclosure are directed to a fixture used in the manufacture of an eyepiece, to cut the eyepiece to a particular shape. Embodiments of the present disclosure are also directed to a method of using the fixture to cut the eyepiece to have the desired shape. Embodiments are directed to a configurable fixture to align, hold, and protect a plastic sheet (referred to herein as a wafer) while a laser cutting apparatus is cutting one or more eyepieces out of the wafer. During the cutting, the fixture protects the eyepieces from reflected laser light by providing voids around the laser cutting lines, and by supporting each eyepiece near its perimeter. The fixture can be quickly rearranged for different eyepieces, different eyepiece shapes, and/or different plastic sheet sizes.

The fixture includes components that help align the surface of the wafer to the laser cutting apparatus, and that hold it in place while the cutting is being performed. The fixture protects the eyepieces from laser light reflection, while also protecting the eyepieces from damage on the edges and the interior of eyepiece. The fixture prevents laser marks on the transparent, plastic eyepieces by reducing and/or eliminating laser reflection off of metal components. The fixture also enables reconfiguration of tool components to laser cut different eyepiece shapes, wafer layouts, different wafer sizes (e.g., wafer diameters and/or widths of 90 mm, 150 mm, etc., wafer thicknesses of 0.325-0.350 mm, etc.), and/or eyepiece quantities, without high machining costs and long lead times.

The fixture can be used in conjunction with a computer numerically controlled (CNC) laser cutter, which enables laser cutting of the wafers. In some instances, the wafers may have grating patterns applied to them prior to cutting, such that the cut eyepieces carry the grating patterns that are suitable for use in an optical device as described below. The fixture is configured to align the wafer relative to the laser cutting tool coordinate system. In some embodiments, the plastic wafer can be molded to include a repeatable, circular diameter edge with a notch that can be used to align the wafer relative to the laser cutting tool coordinate system. In some examples, wafer gratings can be aligned visually to pockets in the inlay. For example, the exit pupil expander (EPE) grating can be aligned to a rectangular pocket in the inlay.

The fixture also supports and holds the wafer in place before, during, and after cutting. The fixture can be rearranged for different plastic eyepiece shapes, wafer layouts, and quantities. Various techniques can be employed to stabilize the wafer. For example, the inlay can support the wafer from below, while the vacuum pulls the wafer into contact with the inlay. In some cases, such as with high air flow from the laser or weaker vacuum due to openings in the partition on the pins, the wafer can be affixed temporarily (e.g., using tape) to the cutting fixture to reduce the chance of slipping. In some embodiments, a thin mechanical clamp can be employed to hold the wafer to the fixture.

Embodiments provide various technical improvements and technical advantages over previously available technology. For example, the fixture described herein produces clearer, more transparent eyepieces, because there are deep trenches rather than metal components near the laser cutting beam's travel path. The fixture also provides significant advantages by accommodating product design and/or wafer layout changes, given that the amount of long-lead machined parts that would be needed cost less and have a shorter lead time than the custom cutting inlays that were previously used.

In some examples, the wafer that is being cut into one or more eyepieces has been previously processed to add grating(s) to the wafer, such that the cut eyepiece(s) can include various eyepiece grating regions with different diffraction gratings to achieve various optical effects. Such regions can include an orthogonal pupil expander (OPE) region, an EPE region, and an in-coupling grating (ICG) region. When the eyepiece is included as a component of a virtual reality headset, augmented reality headset, or other suitable apparatus, a projector of the apparatus may project image light onto the ICG region of an eyepiece layer. The ICG region can couple the image light from the projector into a planar waveguide that propagates the light in a direction toward the OPE region. The waveguide may propagate the image light in the horizontal direction through internal reflection. The OPE region can include a diffractive grating that multiplies and redirects the image light toward the EPE region. For example, the OPE region may multiply the light in an orthogonal direction and direct the multiplied light to various portions of the EPE region. The EPE region can include a (e.g., different) diffractive grating that outcouples and directs at least a portion of the light, in a direction outward from the plane of the eyepiece layer, and/or toward the human viewer's eye. For example, the EPE grating can direct light at an angle that is substantially perpendicular to the plane of the eyepiece layer, and/or at some other angle such as a 45 degree angle relative to the plane of the eyepiece layer. In this fashion, an image projected by the projector may be received and viewed by the viewer's eye. For mixed reality (e.g., augmented or virtual reality) diffraction grating waveguide displays, EPE and OPE regions are used to display an image with an expanded pupil area. Additional configurations are possible wherein the OEP and EPE functions are overlaid, combined, or otherwise superimposed to occupy a single region of the eyepiece on one or both sides.

Although examples herein describe a fixture that can be used to cut shapes from a wafer of plastic, other suitable materials may also be cut using the fixture. For example, a fixture can be used to reduce contamination when cutting glass, crystalline ceramic (e.g., Neo), and/or sapphire. Use of the fixture can also reduce lead time and cost for research and development (R&D) fixtures compared to use of a custom inlay for each wafer design.

Figure 1:
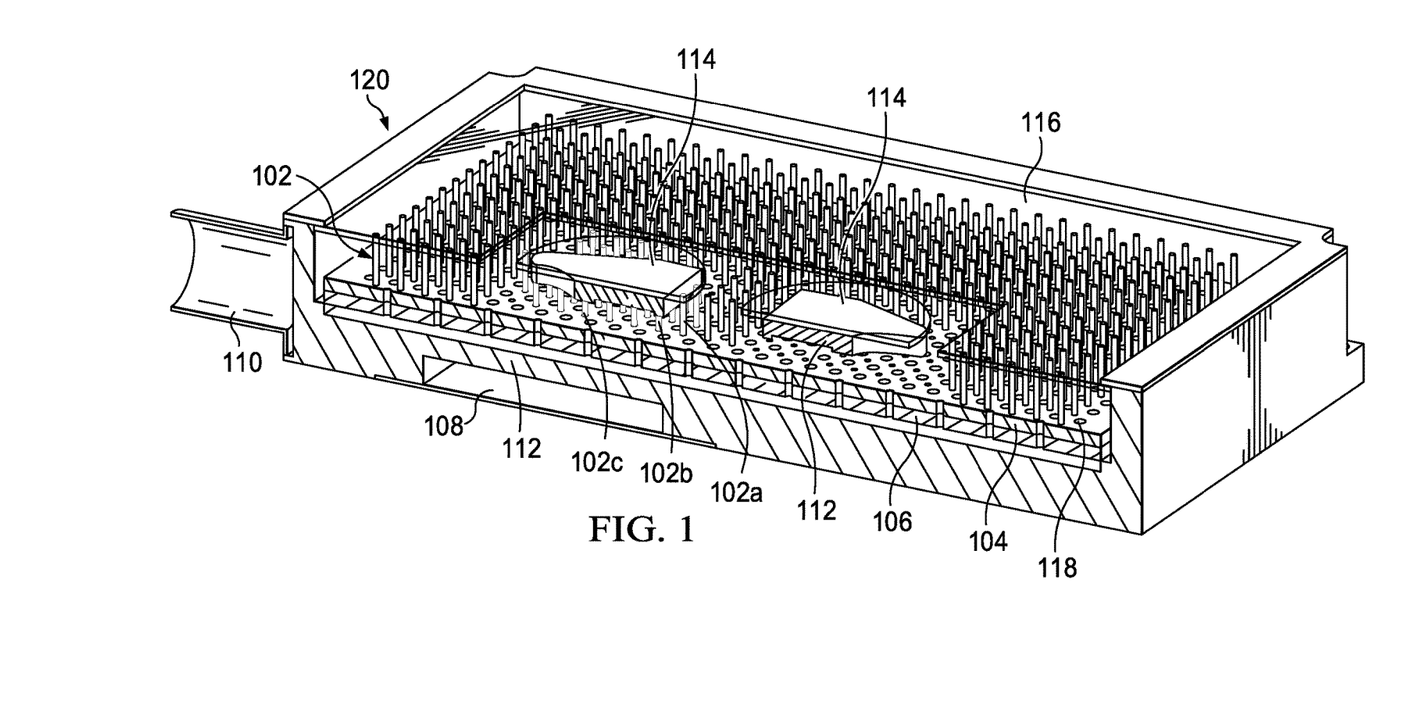
FIG. 1 depicts a schematic of an example fixture for cutting shapes, according to embodiments of the present disclosure.

FIG. 1 depicts an example fixture 120 for cutting eyepiece shapes from a wafer of plastic or other suitable material, according to embodiments of the present disclosure. A floor of the fixture 120 can include any suitable number of holes 118, some of which are configured to hold pins 102 that extend upward from the floor. At least some of the holes 118 may provide for air flow to support an exhaust ventilation feature of the fixture 120, to carry away debris that is generated during the laser cutting of the plastic. Holes 118 used to hold pins are referred to herein as pin holes. Holes used for ventilation are referred to herein as ventilation holes. In some embodiments, a first floor 104 of the fixture 120 may include both pin holes and ventilation holes. A second floor 106, below the first floor 104 and flush against it, may include ventilation holes that are substantially aligned with the ventilation holes of the first floor 104. In some instances, the second floor 106 may not include the pin holes, thus providing a surface on which the pins 102 may rest as the pins 102 are supported by the pin holes through the first floor 104. A cavity 108 beneath the second floor 106 may allow air from above to flow through the ventilation holes, through the cavity 108, and out of the fixture 120 through a duct 110. This ventilation system allows air to carry away debris (e.g., plastic debris caused by the cutting) out of the fixture 120, thus reducing the likelihood that the debris will cause damage or degradation to the eyepieces being cut. In some examples, the pin holes are smaller in diameter than the ventilation holes. The ventilation system can also provide a suction effect for maintaining a position of the wafer during cutting. Accordingly, the vacuum can hold the wafer and carry away debris below the wafer. A separate vacuum, with weaker force can also be used above the wafer, in some embodiments.

In some examples, the ventilation holes provide air flow and the pin holes may not provide air flow, given that the pin holes 118 extend through the first floor 104 and not second floor 106, and are not in communication with duct 110. The pin holes may penetrate the first floor and/or be approximately 2 mm deep, and the ventilation holes may penetrate the first floor and the second floor. In some examples, both types of holes may provide at least some ventilation capability. For example, smaller ventilation holes may be included in the second floor 106 that are substantially aligned and/or coincident with larger pin holes 118 in the first floor 104.

Figure 1A:
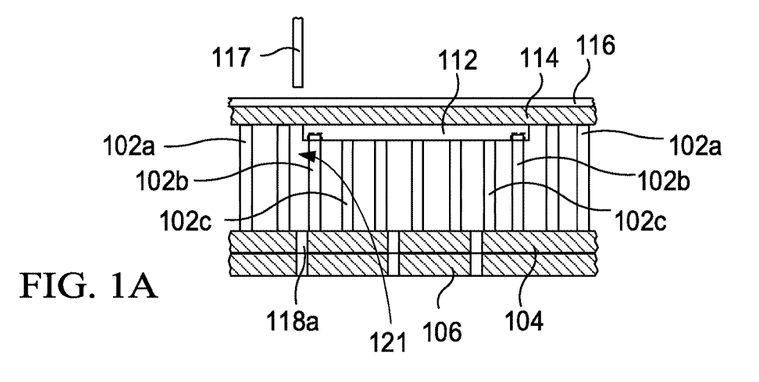
FIG. 1A is a schematic side view of the example fixture for cutting shapes shown in FIG. 1.

In some embodiments, different lengths of pins 102 are used to provide different function and support and/or stabilize different components. The pins 102 may be the same, or substantially similar, in diameter, such that any pin 102 may be placed in pin hole 118, thus providing for easy change of configuration of the fixture 120. FIG. 1A is a schematic side view of the example fixture for cutting shapes shown in FIG. 1. The long pins 102*a* can support the wafer 114 (e.g., a plastic substrate) or a vacuum cover 116. Medium pins 102*b* can be used to align an inlay 112 (e.g., a machined aluminum eyepiece template, in the shape of the eyepiece to be cut) in the horizontal plane, preventing movement of the inlay 112 in x- and y-direction with the fixture (e.g., where the x-y plane is substantially parallel to the floor(s) of the fixture). In some embodiments, aluminum is used for the template because it is cleanroom compatible, and can be anodized black. Other cleanroom compatible metals that can be coated and/or colored black could also be used, including but not limited to steel or stainless steel painted black, or titanium with a black coating.

The inlay 112 can include holes or indentations that the medium pins 102 fit into, to stabilize the inlay 112 in the horizontal plane and prevent movement of the inlay 112 before, during, and after cutting. The short pins 102*c* support the inlay 112 from below, in the vertical direction. For clarity, some of the pins under and around the inlays 112 (and especially the inlay on the right) are not shown in FIG. 1. The pins 102 can be arranged in the floor 104 in the pin holes 118. The wafer 114 to be cut rests on top of the inlay 112 and the top of long pins 102*a*, which are substantially level. Areas of the fixture 120 that are not supporting the wafer 114 may be covered with a thin, plastic vacuum cover 116, the shape of which can be quickly and cheaply customized using scissors or other suitable tools.

When the components are assembled in preparation for cutting, the wafer 114 rests on top of the long pins 102*a*. Shorts pins 102*c* can be placed to support the inlay(s) 112, with the inlay(s) 112 being placed under the wafer 114. The medium pins 102*b* stabilize the inlay(s) 112 in the x-y plane as described above. In this example view, the cutting laser 117 is looking down onto the assembly. Any suitable length of the short, medium, and long pins 102 can be employed. For example, the long pins 102*a* may each be 24 mm long, the short pins 102*c* may each be 18 mm long, and the medium pins 102*b* may be each 20 mm long (within acceptable tolerance of variation in the lengths). The pins 102 may have substantially the same cross-sectional shape and same diameter, to provide for flexibility in the configuration of the apparatus to hold different numbers and shapes of inlays 112 and to cut different numbers and shapes of eyepieces out of the wafer 114. In some examples, the inlay 112 is flush against the wafer 114 to provide for more accurate cutting by the cutting laser 117. If there were any clearance between wafer 114 and inlay 112, the wafer 114 may flex if it were not fully supported by the inlay 112 from below. In some configurations, the laser cutting apparatus may cut a shape that is substantially the same as the shape of the inlay 112, although the laser cutting may be controlled independently of the inlay 112 shape (e.g., by a computer controlling the laser). The cutting laser 117 may be programmed to follow the perimeter of the inlay 112, or just outside of the perimeter of the inlay 112, such that inlay 112 represents the shape of the eyepiece that is to be cut out from the wafer 114.

The (e.g., rectangular) vacuum cover 116 over the assembly can be placed to provide a stronger vacuum suction over the exhaust area, and to ensure that that applied vacuum is pulling on all portions of the cover 116. The cover 116 may have a gap over each position where an eyepiece is to be cut from the wafer, with a gap between the edge of the inlay 112 to the edge of the gap in the cover 116. In some examples, this gap may be minimized to provide stronger vacuum.

Cutting plastic with a laser generates a cloud of debris. The debris is scattered everywhere, and can land on the plastic part that has been warmed by the laser. The debris may permanently stick to the plastic part as it cools, and is not easily removed once the plastic cools. In some examples, to avoid debris, a rigid plastic (i.e. PMMA) sheet is placed under the wafer 114 to provide a barrier for the debris. By using such a sheet, there is less clearance between the wafer 114 and the rigid plastic sheet that provides a barrier. Also, a (e.g., thin) sheet of plastic may be placed on top of the wafer 114 as another debris barrier. By using a thin sheet, it may be easier for the laser to cut through the top sheet and continue cutting the wafer 114. In some examples, the three sheets can be taped together using polyimide tape or any tape that is easily removed.

In some embodiments, an approximately 1.1 mm thick piece of PMMA can be used underneath the wafer. Alternatively, instead of the plastic sheet, a thin plastic film such as a semiconductor dicing tape product (e.g., including PVC film and adhesive) can be used under the plastic water and on top of the wafer. Semiconductor dicing tape can be used on both sides to protect the wafer from cutting debris.

Previously available solutions included shapes or surfaces that caused reflections of the laser light onto the plastic being cut. Such reflections caused marks to be etched into the surface of the plastic, leaving flaws in the cut eyepieces that could negatively impact eyepiece performance. The fixture 120 described herein uses materials that are less reflective (e.g., anodized aluminum) and/or surfaces that tend to scatter the laser light (e.g., round pins), reducing or eliminating such reflections.

The fixture 120 provides for a space 121 beneath the plastic that is being cut. That space 121 is also referred to as a trench. For optimal cutting, the depth of the trench (e.g., the amount of clearance that is open under the wafer that is being cut) is approximately 15-25 mm for plastic cutting.

The trench is present along the cutting line where the laser is cutting the plastic, and has sufficient depth to reduce reflection.

The short pins 102 may provide support for the interior of the inlay 112 and hold up the center to prevent bowing of the inlay 112 and the water portion on top of the inlay 112. The cover 116 is present to ensure strong vacuum suction and prevent the wafer from sliding around. In one example, the wafer 114 size is approximately 100 mm square, and the cover 116 is approximately 400 mm square fitting within the fixture 120 as shown in the figures.

In some embodiments, the short pins may not be used, and the inlay(s) 112 may rest on the floor 104 of the fixture 120. In such examples, the inlay(s) 112 may be machined thick enough to provide the appropriate trench depth for cutting. In general, the trench depth is the thickness of the inlay 112 plus the length of the short pins (if used).

In some embodiments, the wafer 114 may have a protective film that is in place on the wafer 114 (on one or both sides of the wafer) while the wafer is being cut. Use of the film may further prevent debris from coalescing on the warm plastic, causing a whitening effect along the edge of the eyepiece. In some examples, the fixture 120 may be made of aluminum which has been anodized to reduce reflection of the laser light toward the eyepiece being cut. The pins may be made of stainless steel, (e.g., anodized) aluminum, or any other suitable material. In one example, the spacing between holes 118 in the floor(s) is 10 mm between pin holes, and 10 mm between ventilation holes, in both x- and y-direction. The holes may be placed sufficiently close to one another to provide suitable flexible in arranging the pins to support different shapes and numbers of inlays 112 for eyepiece cutting.

Embodiments can employ any suitable spacing between pin holes and/or ventilation holes, and may employ any suitable number of pins in the inlay to provide appropriate support and stabilization. For example, spacing of 8-20 mm between the holes 118 can be used. Any number of sets of two of the medium length pin (e.g., 20 mm long) can be used to set the x and y location of the inlay. Any number of sets of four of the shortest length pin (e.g., 18 mm long) can be used to support the z position of the inlay. Accordingly, a set of six pins minimum may be used to support and stabilize the inlay.

In some embodiments, the medium pins 102 are set into holes in the inlay 112, to prevent the inlay 112 from moving in the x-y plane. The short pins 102 can support the inlay 112 from below. In some embodiments, one or both sides of the inlay 112 may have a recess cut out of the interior of the inlay 112, such that the inlay 112 has a lip around its perimeter. This recess serves to minimize contact between the inlay 112 and the wafer 114, to minimize any scraping of and damage to the gratings in the eyepiece portion of the wafer 114 that might be caused by contact with the inlay 112. The inlay 112 also helps keep the eyepiece portion of the wafer flat, so that the vacuum pulling on the wafer 114 does not deform the eyepiece portion that is being cut out.

The trench underneath the cutting lines may be defined by the grid of pins 102 placed relative to the inlay 112. The pins 102 along the cutting contour may be removed to provide the trench such that holes near a perimeter of the inlay 112 are empty. The trench depth can be a function of pin length and inlay thickness, as described above. The grid of pin holes can be machined such that each hole has a sliding fit with the pin, to provide for easy insertion and removal of the pins to and from the pin holes. The fixture 120 provides that the pins can be arranged in any appropriate number of combinations to support inlay(s) and wafer, and to provide the appropriate deep trenches for cutting. The inlay(s) 112 are moveable and readily replaceable, and have a minimized footprint for reduced cost and lead time.

Figure 2:
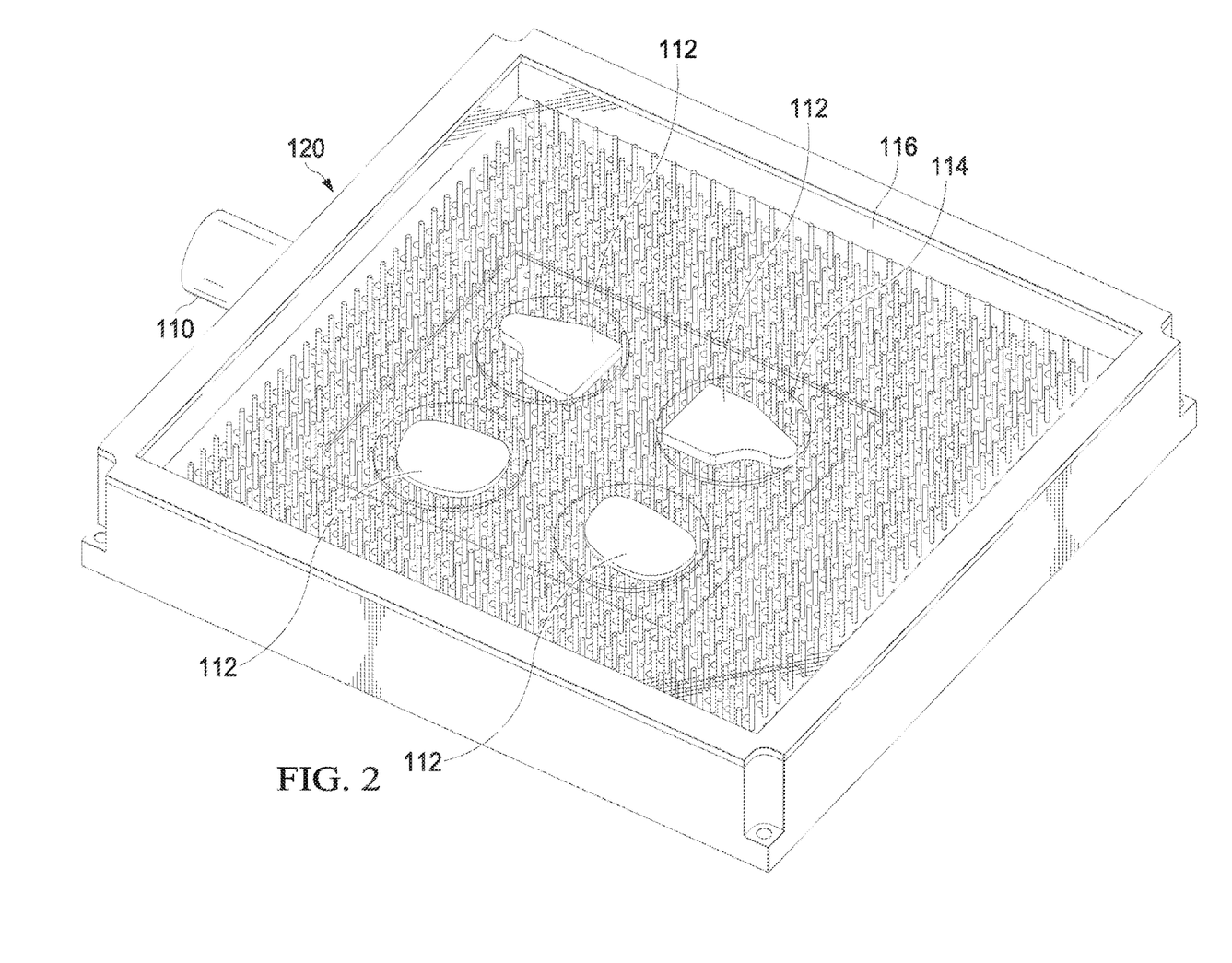
FIG. 2 depicts a schematic of an example fixture for cutting shapes, according to embodiments of the present disclosure.

FIG. 2 depicts an example fixture 120 for cutting eyepiece shapes, according to embodiments of the present disclosure. FIG. 2 shows a view of the fixture 120 more from above, with the templates 112 placed for different eyepiece shapes to be cut. The wafer sits on top of the inlays 112 as discussed above, and the cover 116 sits on top of the wafer 114.

Figure 3:
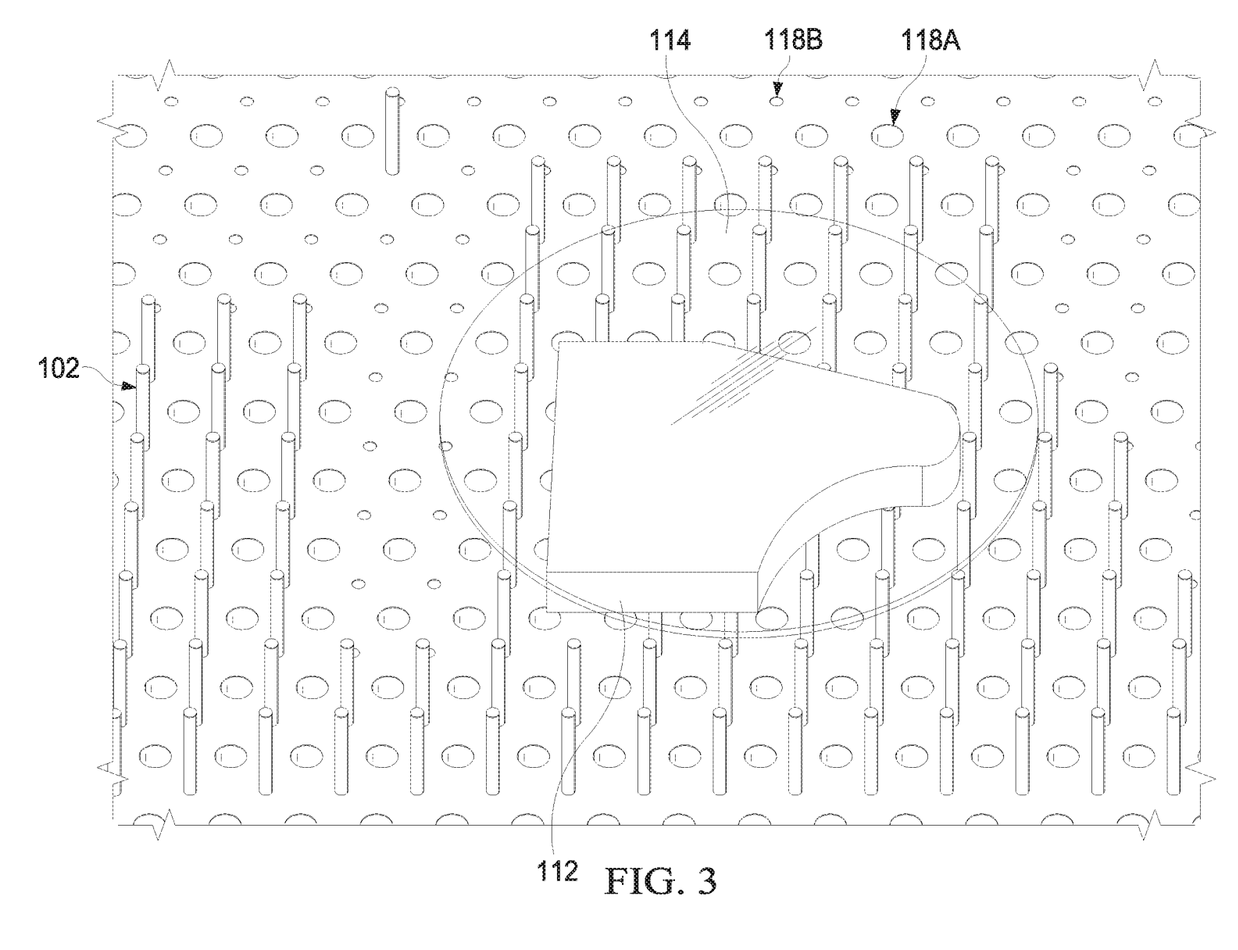
FIG. 3 depicts a portion of an example fixture, according to embodiments of the present disclosure.

FIG. 3 depicts a portion of an example fixture 120, according to embodiments of the present disclosure. FIG. 3 shows the pins 102 of varying length and position supporting the inlay 112 and wafer 114, and stabilizing the inlay 112 against movement. FIG. 3 also shows the different types of holes 118, including an array of ventilation holes 118A and an array of pin holes 118B, where the ventilation holes may extend through all layers of the floor and the pin holes may extend only partially through the floor.

Figure 4:
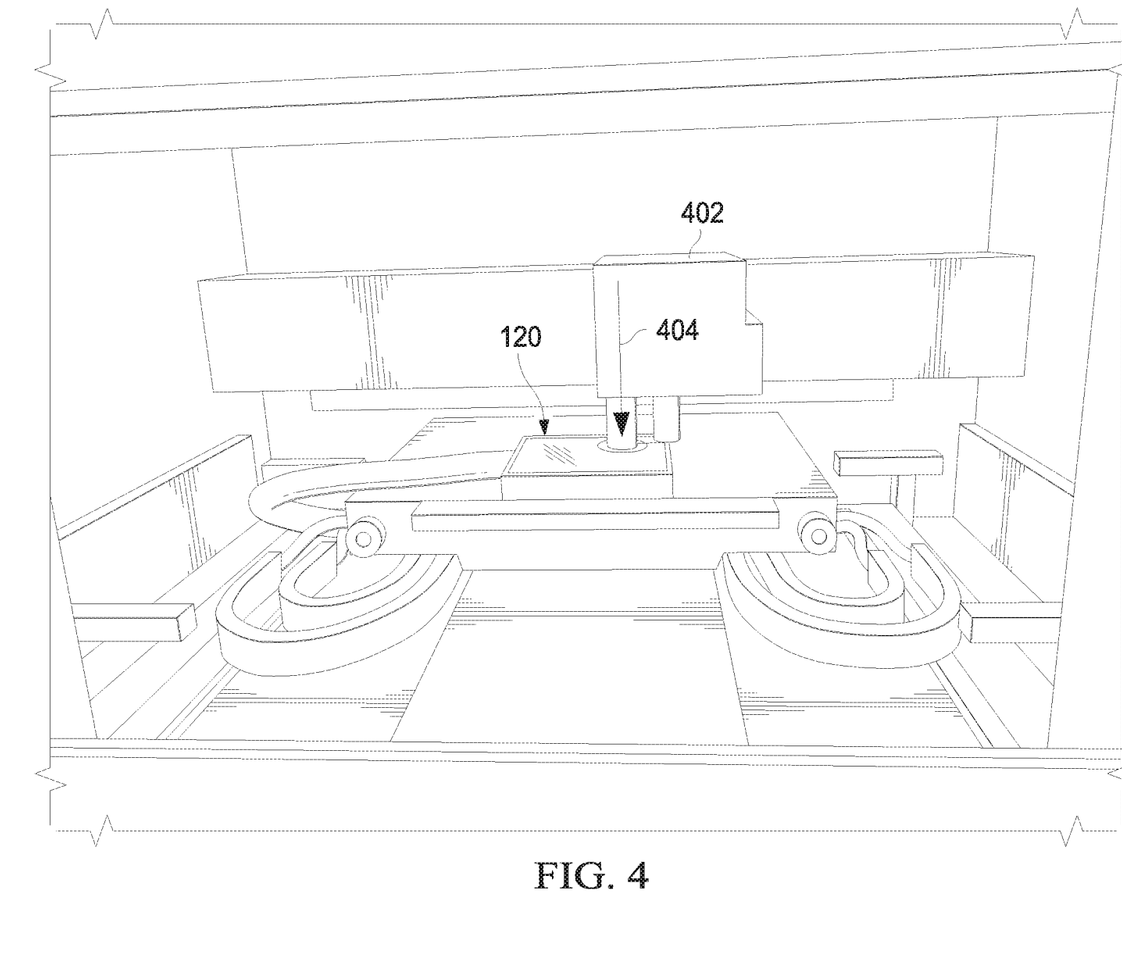
FIGS. 4-6 depict an example fixture being used in an example cutting apparatus, according to embodiments of the present disclosure.
Figure 5:
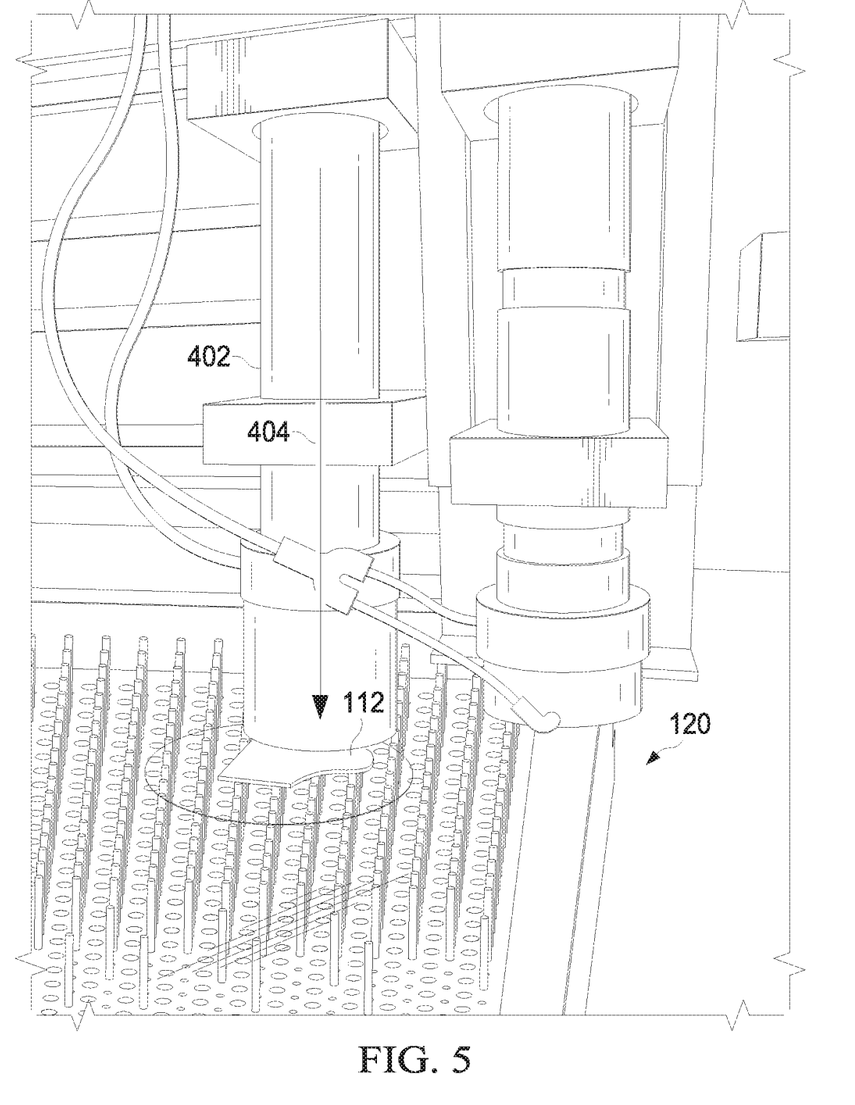
Figure 6:
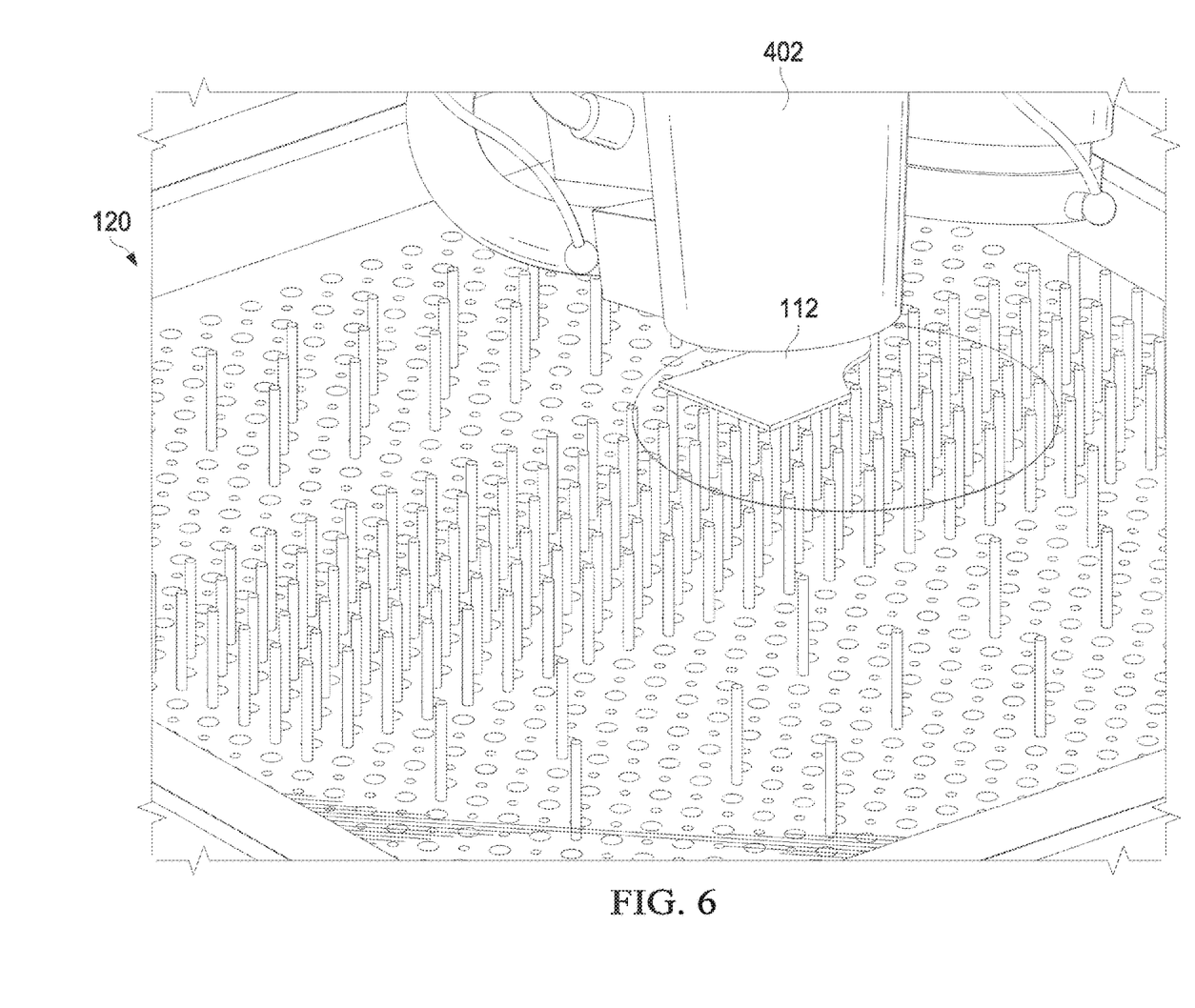

FIGS. 4-6 depict an example fixture 120 being used in an example cutting apparatus 402, according to embodiments of the present disclosure. FIG. 4 depicts fixture 120 placed below the laser cutting apparatus 402, with a direction of the cutting laser shown by the arrow 404. FIG. 5 is a closer view of the fixture 120 beneath the cutting laser 402. FIG. 5 provides a different close view of the fixture 120 beneath the cutting laser 402, with the inlay 112 arranged accordingly to the outline of the eyepiece to be cut. As shown in FIG. 6, the wafer from which eyepieces are cut can be significantly larger than the inlay size in some embodiments. In such configurations, one of skill in the art will appreciate that the wafer itself may serve as the vacuum cover 116 (e.g., as shown in FIG. 1).

Figure 7:
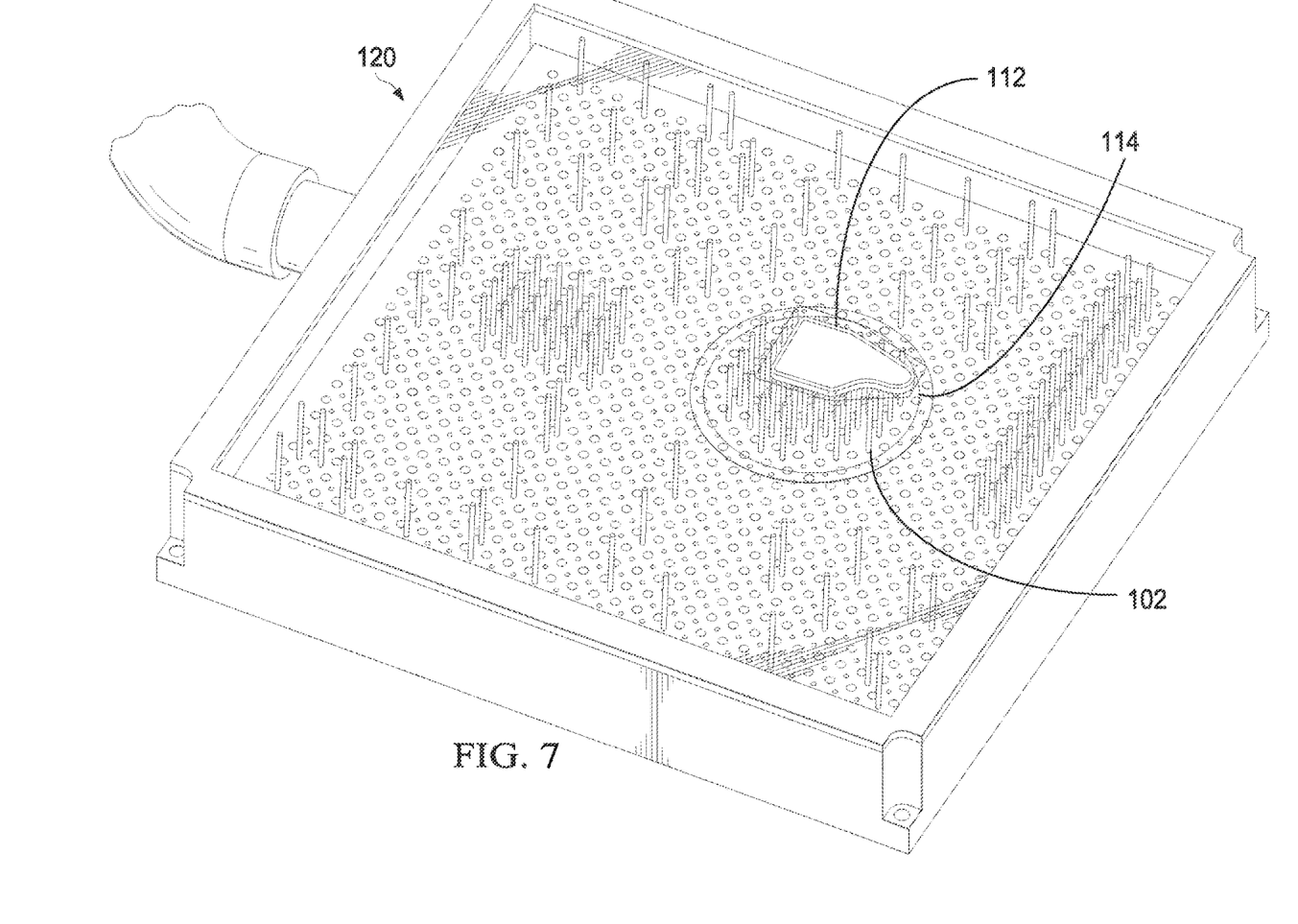
FIG. 7 depicts an example fixture, according to embodiments of the present disclosure.

FIG. 7 depicts an example fixture 120, according to embodiments of the present disclosure, where an inlay 112 is supported by pins 102 inserted into holes in a floor of the fixture 120. As shown in this example, a wafer 114 is positioned over the inlay 112 in preparation for cutting out an eyepiece around the outside perimeter of the wafer material.

Figure 8A:
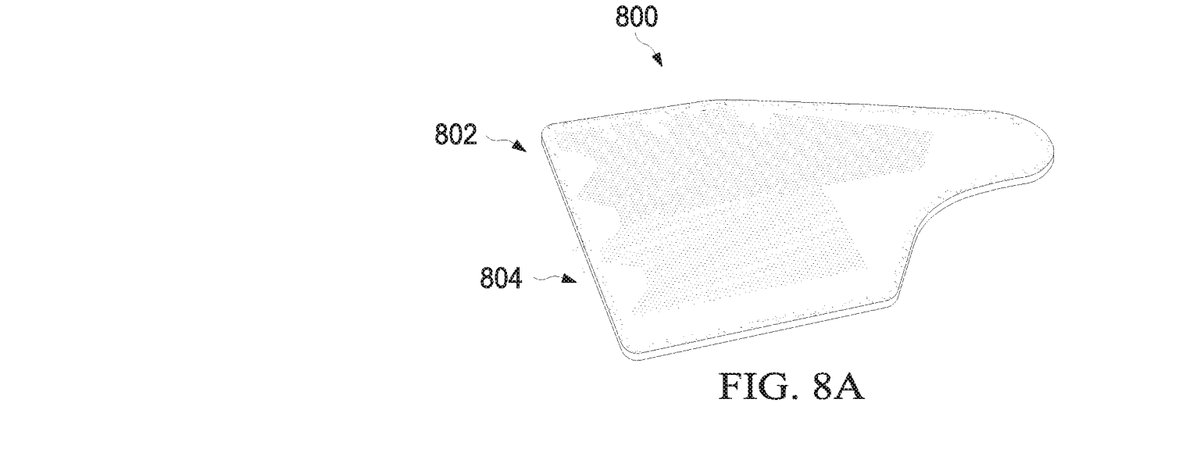
FIG. 8A depicts an example eyepiece manufactured according to previously available techniques.

As discussed above, previously available techniques left an undesired etching on the eyepiece, caused by laser light reflected off surfaces of the previously used fixture. FIG. 8A depicts an example eyepiece 800 manufactured according to such previously available techniques, with an undesirable artifact of etching left by the manufacturing process. In FIG. 8A, a honeycomb (e.g., hex-shaped) pattern 802 can be seen along the edges of the EPE and OPE. A cloudy appearance 804 can also be seen along the part edge, even where no gratings are present. This can be caused by the laser having reflected off the previously used stainless steel honeycomb fixture and burned away the gratings in the visible honeycomb pattern. This results in crooked, wavy, and/or hex-shaped OPE and EPE edges, such that the eyepiece may not meet requirements for quality.

Figure 8B:
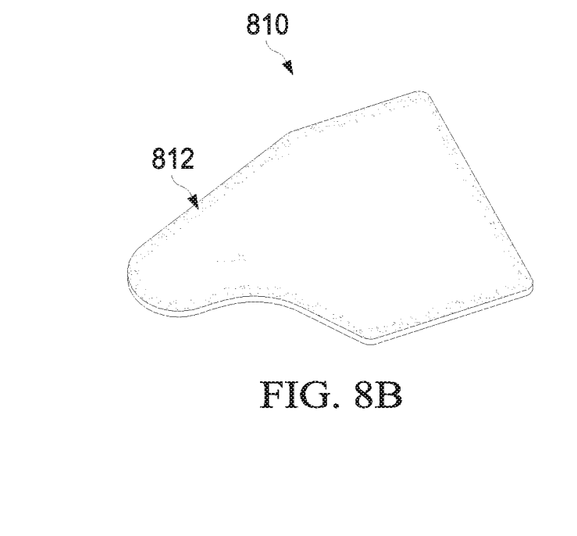
FIGS. 8B and 8C depict example eyepieces manufactured according to embodiments of the present disclosure.
Figure 8C:
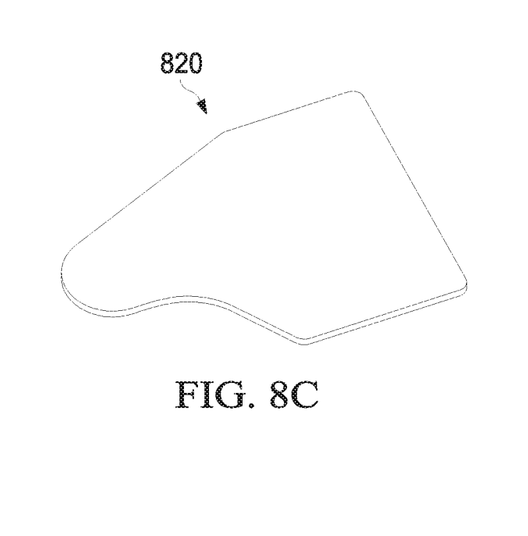

FIGS. 8B and 8C depict example eyepieces 810, 820, respectively, manufactured according to embodiments of the present disclosure. Eyepiece 810 shows an example eyepiece that is cut while not having the protective film, leading to the whitening 812 around the edge caused by implanted debris. Eyepiece 820 shows an example eyepiece that is cut while the protective film is on the wafer, thus preventing the edge whitening.

Figure 9A:
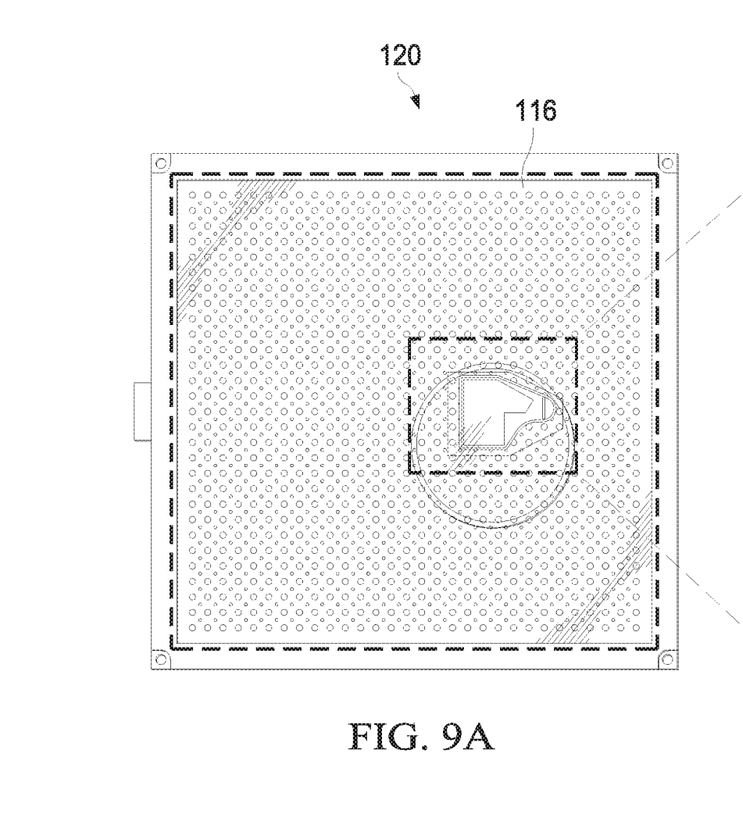
FIGS. 9A and 9B depict an example fixture, according to embodiments of the present disclosure.
Figure 9B:
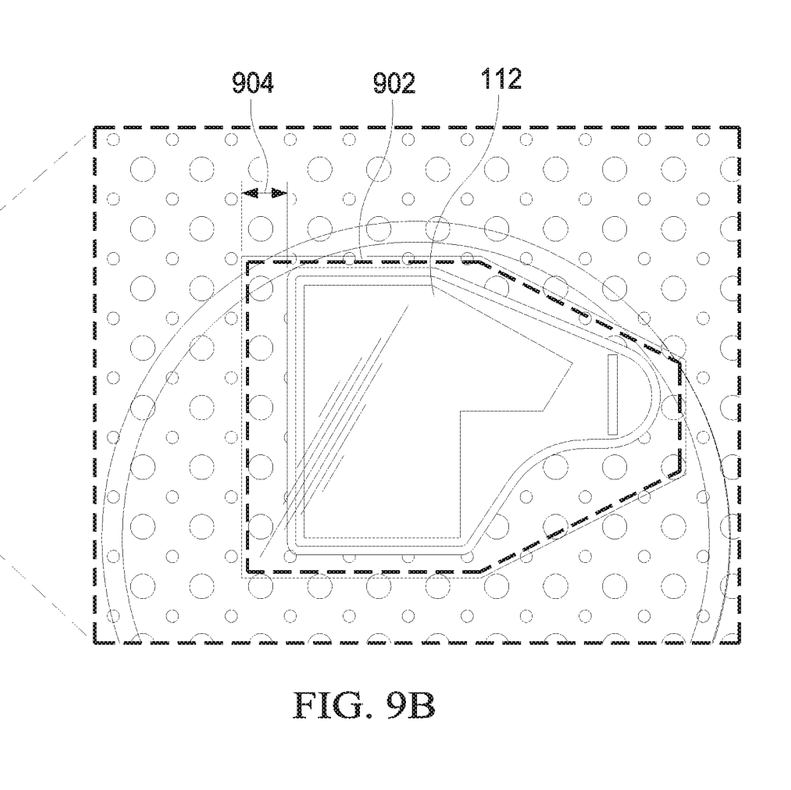

FIGS. 9A and 9B depict example fixture 120, according to embodiments of the present disclosure. Fixture 120 includes a dotted overlay that shows an outer boundary of the cover 116 described above. As shown in this example, the cover 116 may sit on each of the edges of the fixture 120 to provide suitable vacuum. FIG. 9B includes a dotted overlay 902 that shows the inner cutout of the cover 116 to illustrate a boundary of the gap 904 between the cover 116 and an outer perimeter of a wafer that may be present over each of the eyepieces to be cut, as described above. In this example, the cover is overlaid on the wafer so that there is some overlap at the outside edges of the wafer. The wafer rests directly on the inlay and pins. The thin vacuum cover rests on top of the wafer, with a cutout portion to make the cutting profile available to the laser.

Figure 10A:
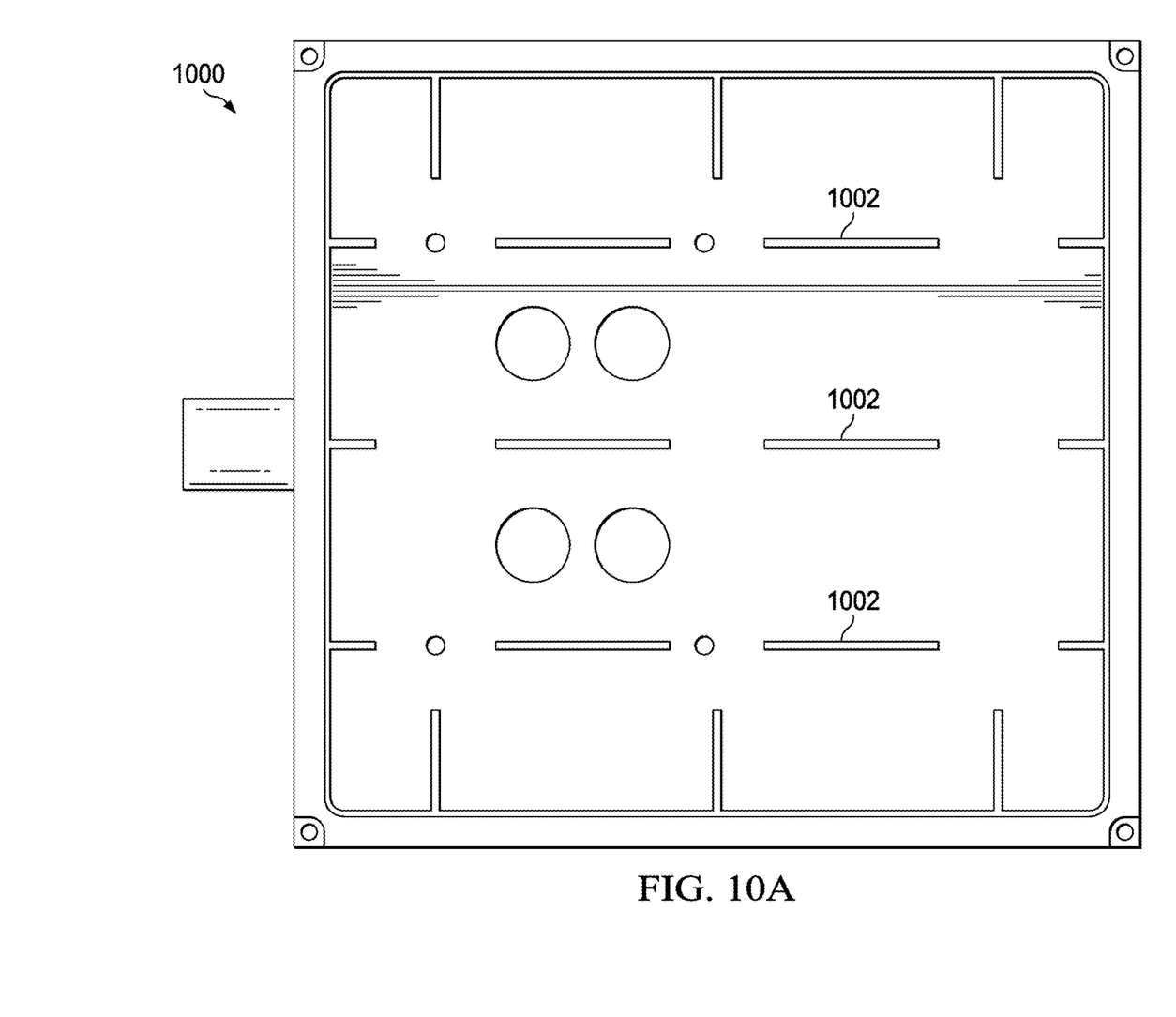
FIGS. 10A and 10B depict an example fixture, according to embodiments of the present disclosure.
Figure 10B:
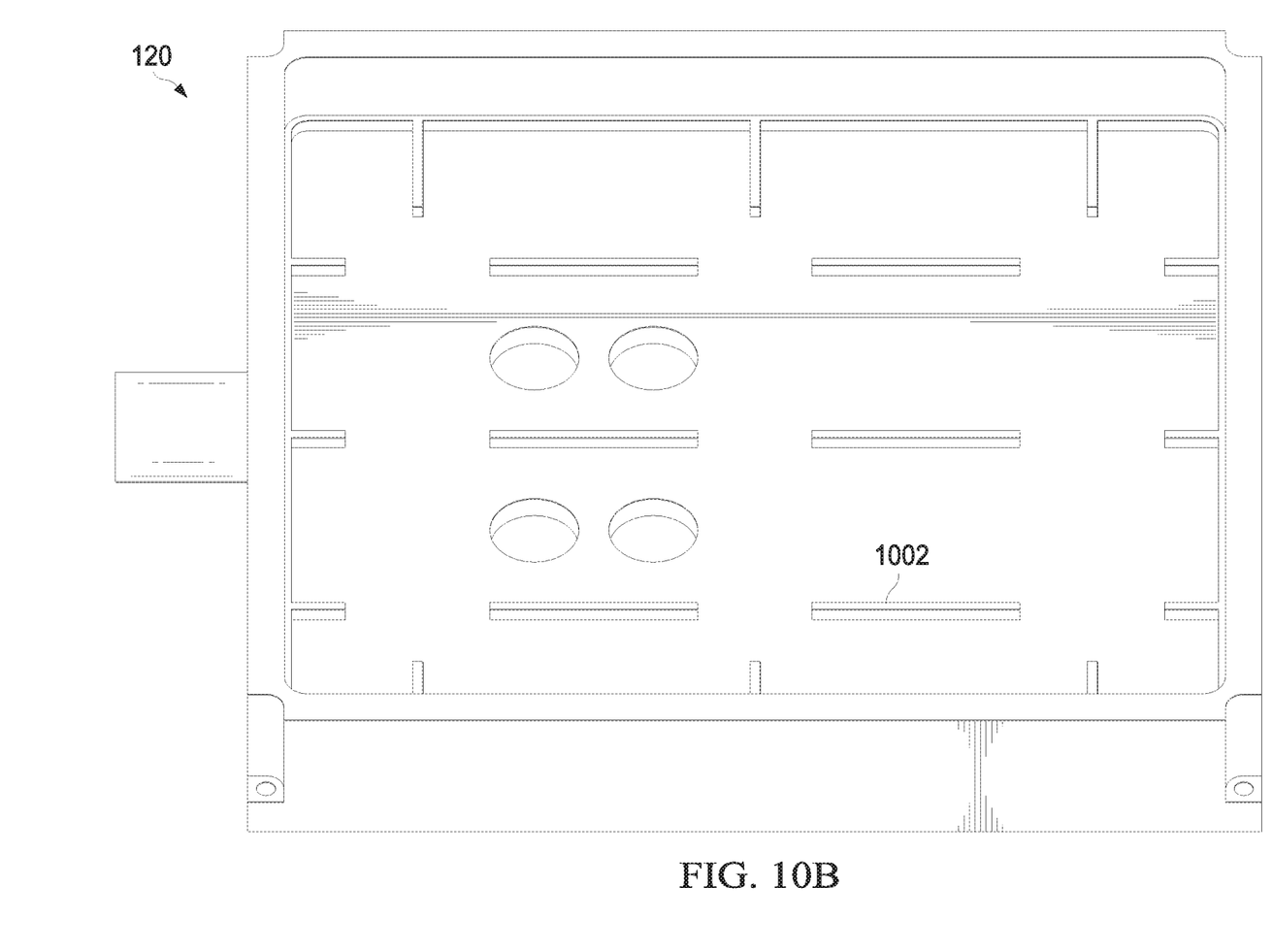

FIGS. 10A and 10B depict example fixture 120, according to embodiments of the present disclosure. In this example, the fixture 120 includes ribs 1002 that support two plates that each include the (e.g., 4 mm) ventilation holes, with one of the two plates also including the (e.g., 2 mm) pin holes as well. The pins could contact the bottom of this enclosure, and/or contact the ribs depending on the location. The pin height may vary depending on whether the pins are placed into holes to contact the bottom of the enclosure or the rib.

While this specification contains many specific details, these details should not be construed as limitations on the scope of the disclosure or of what may be claimed, but rather as examples of features that are associated with particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some examples be excised from the combination, and the claimed combination may be directed to a sub-combination or variation of a sub-combination.

A number of embodiments have been described. Nevertheless, it will be understood that various modifications may be made without departing from the spirit and scope of the disclosure. For example, various structures shown above may be used, with elements rearranged, positioned differently, oriented differently, added, and/or removed. Accordingly, other embodiments are within the scope of the following claims.

What is claimed is:

1. An apparatus for cutting a wafer into one or more shapes, the apparatus comprising:
   a fixture including a first floor, wherein the first floor includes an array of pin holes;
   a plurality of pins coupled in the first floor, the plurality of pins comprising:
      long pins that are held in a first set of pin holes in the array of pin holes of the first floor,
      medium pins that are shorter than the long pins and held in a second set of pin holes in the array of pin holes of the first floor, and
      short pins that are shorter than the medium pins and held in a third set of pin holes in the array of pin holes of the first floor; and
   an inlay that rests on the short pins of the plurality of pins, wherein the inlay includes holes that receive the medium pins of the plurality of pins to stabilize the inlay from moving in a direction parallel to the first floor,
   wherein the long pins are configured such that the wafer contacts and rests on the long pins and the short pins are configured such that the inlay contacts and rests on the short pins while a laser cuts, from the wafer, a shape that corresponds to the inlay, and such that the cut portion of the wafer rests on the inlay.

2. The apparatus of claim 1, wherein the wafer is held above the first floor to define a space below the wafer having a depth equal to the sum of a thickness of the inlay and a length of the short pins.

3. The apparatus of claim 2, wherein the depth is in a range of 15-25 mm.

4. The apparatus of claim 1, wherein the fixture further includes a second floor below the first floor.

5. The apparatus of claim 4, wherein the first floor and the second floor each include an array of ventilation holes.

6. The apparatus of claim 4, wherein the fixture further includes a cavity below the second floor.

7. The apparatus of claim 1, further comprising a cover that rests on at least a portion of the wafer.

8. The apparatus of claim 1, wherein the inlay includes a recess defining a lip around the perimeter of the inlay.

9. The apparatus of claim 8, wherein the short pins contact the inlay in the recess.

* * * * *